(12) United States Patent
Kurz et al.

(10) Patent No.: US 8,785,300 B2
(45) Date of Patent: Jul. 22, 2014

(54) BEOL ANTI-FUSE STRUCTURES FOR GATE LAST SEMICONDUCTOR DEVICES

(71) Applicant: GlobalFoundries Inc., Grand Cayman (KY)

(72) Inventors: Andreas Kurz, Dresden (DE); Jens Poppe, Radebeul (DE)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/942,800

(22) Filed: Jul. 16, 2013

(65) Prior Publication Data
US 2013/0299940 A1   Nov. 14, 2013

Related U.S. Application Data

(62) Division of application No. 13/232,681, filed on Sep. 14, 2011, now Pat. No. 8,507,326.

(51) Int. Cl.
*H01L 21/326* (2006.01)
*H01L 21/479* (2006.01)

(52) U.S. Cl.
USPC ............................. 438/467; 438/600; 438/131

(58) Field of Classification Search
USPC .......................................... 438/467, 600, 131
See application file for complete search history.

(56) References Cited

U.S. PATENT DOCUMENTS 6,498,056 B1   12/2002   Motsiff et al.
8,471,356 B2 *   6/2013   Cheng et al. .................. 257/530

* cited by examiner

*Primary Examiner* — Thien F Tran
(74) *Attorney, Agent, or Firm* — Ditthavong & Steiner, P.C.

(57) ABSTRACT

An approach is provided for semiconductor devices including an anti-fuse structure. The semiconductor device includes a first metallization layer including a first portion of a first electrode and a second electrode, the second electrode being formed in a substantially axial plane surrounding the first portion of the first electrode, with a dielectric material in between the two electrodes. An ILD is formed over the first metallization layer, a second metallization layer including a second portion of the first electrode is formed over the ILD, and at least one via is formed through the ILD, electrically connecting the first and second portions of the first electrode. Breakdown of the dielectric material is configured to enable an operating current to flow between the second electrode and the first electrode in a programmed state of the anti-fuse structure.

9 Claims, 3 Drawing Sheets

BEOL ANTI-FUSE STRUCTURES FOR GATE LAST SEMICONDUCTOR DEVICES

CROSS REFERENCE TO RELATED APPLICATIONS

This application is a divisional of U.S. application Ser. No. 13/232,681 filed Sep. 14, 2011. The entirety of which is incorporated herein by reference.

TECHNICAL FIELD

The present disclosure relates to anti-fuse structures for semiconductor devices. The present disclosure is particularly applicable to gate last semiconductor technologies.

BACKGROUND

As the dimensions of transistor devices continue to shrink and the packing density improves, more complex integrated circuits are being produced in which different portions of the circuit may exhibit different behaviors over the life of the device. As a result, electrical fuses or e-fuses are being used in semiconductor devices to adapt the performance of certain circuit portions to comply with the performance of other circuit portions. E-fuses represent electronic switches that may be activated once to provide a desired circuit adaptation; once programmed the programmed state of an electrical fuse is irreversible. For this reason, electrical fuses are referred to as one-time-programmable (OTP) elements.

Programming or lack thereof constitutes one bit of stored information associated with an electrical fuse. Semiconductor fuses have a relatively low initial resistive state that may be changed to a relatively higher resistive state through programming, e.g., through electrical bias conditions applied to the fuse. Conventionally, fuses have been formed from the semiconductor material, such as polysilicon, concurrently with the semiconductor gate electrodes. However, as transistors have decreased in size, the polysilicon gate electrodes have been replaced with metal electrodes which are formed by gate last technologies, such as replacement gate processes. With the polysilicon removed, polysilicon fuses can no longer be built. Back-end-of-line (BEOL) metal fuses have, therefore, been implemented instead of the polysilicon fuses. However, standard metal fuses formed BEOL require a high programming current and occupy a significant amount of space, as they entail multiple metal layers and vias and include bent metal portions.

A need therefore exists for methodology enabling formation of fuse structures that may be programmed at relatively low power supply voltages and occupy less semiconductor real estate, and the resulting devices.

SUMMARY

An aspect of the present disclosure is an anti-fuse structure for semiconductor devices.

Another aspect of the present disclosure is a method for forming an anti-fuse structure for semiconductor devices.

Yet another aspect of the present disclosure is a method for programming an anti-fuse structure for semiconductor devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a first metallization layer including a first portion of a first electrode and a second electrode, the second electrode being formed in a substantially axial plane surrounding the first portion of the first electrode; a dielectric material formed in the substantially axial plane between the second electrode and the first portion of the first electrode and surrounding the first portion of the first electrode; an interlayer dielectric (ILD) over the first metallization layer; a second metallization layer over the ILD, the second metallization layer including a second portion of the first electrode; and at least one via through the ILD, electrically connecting the first and second portions of the first electrode, wherein breakdown of the dielectric material is configured to enable an operating current to flow between the second electrode and the first electrode in a programmed state of the device.

Aspects of the present disclosure include the second electrode being concentrically formed about the first portion of the first electrode. Another aspect includes the second electrode having a ring or oval shape. Other aspects include a distance between the first portion of the first electrode and the second electrode being 40 nanometers (nm). Further aspects include one to ten vias electrically connecting the first and second portions of the first electrode. Another aspect includes a semiconductor layer including at least one integrated circuit (IC) device; and a second ILD over the IC device, wherein the first and second metallization layers are respectively formed above the second ILD. Other aspects include the first metallization layer being a metal 1 layer; and the dielectric material including SiCOH having a dielectric constant of 2.7. Additional aspects include the first metallization layer being one of a metal 2 layer through a metal 8 layer; and the dielectric material including an ultra low-k (ULK) material having a dielectric constant of 2.55 Further aspects include application of approximately 1 to 2 volts across the anti-fuse material causing the breakdown.

Another aspect of the present disclosure is a method including: forming a first metallization layer on an insulating layer, the first metallization layer including, in a substantially axial plane, a first portion of a first electrode of an anti-fuse structure and a second electrode about the first portion of the first electrode, but separated therefrom; forming, in the substantially axial plane, a dielectric material surrounding the first portion of the first electrode, between the first portion of the first electrode and the second electrode; forming an ILD over the first metallization layer; forming at least one via through the ILD over the first portion of the first electrode; and forming a second metallization layer over the ILD, the second metallization layer including a second electrode over the at least one via, wherein the at least one via electrically connects the first and second portions of the first electrode, wherein breakdown of the anti-fuse material is configured to enable an operating current to flow between the second electrode and the first electrode in a programmed state of the anti-fuse structure.

Aspects of the present disclosure include forming the second electrode concentrically about the portion of the first electrode. Another aspect includes forming the second electrode as a ring or oval around the first portion of the first electrode. Other aspects include forming the second electrode separated from the first electrode by 40 nm. Further aspects include forming 1 to 10 vias electrically connecting the first and second portions of the first electrode. Additional aspects include forming a semiconductor layer including at least one IC device; forming the insulating layer over the IC device; and forming the first and second metallization layers, respectively, above the semiconductor layer. Other aspects include forming the first metallization layer as a metal 1 layer; and forming the dielectric material of SiCOH having a dielectric constant of 2.7. Another aspect includes forming the first metallization layer as one of a metal 2 layer through a metal 8 layer; and forming the dielectric material of a ULK material having a dielectric constant of 2.55. Further aspects include application of approximately 1 to 2 volts across the dielectric material causes the breakdown.

Another aspect of the present disclosure is a method including: initiating a programming current in an anti-fuse structure configured to prevent an operating current from flowing between a first electrode and a second electrode in a non-programmed state of the anti-fuse structure, the programming current being configured to flow in a substantially axial plane between the first electrode and a portion of the second electrode, the first electrode and the portion of the second electrode being concentrically separated by a dielectric material; and terminating the programming current after sufficient breakdown of the dielectric material, wherein sufficient breakdown of the dielectric material enables the operating current to flow between the first electrode and the second electrode in a programmed state of the anti-fuse structure.

Aspects of the present disclosure include the first electrode and the portion of the second electrode are formed as part of a first metallization layer of a semiconductor device, and a second portion of the second electrode is formed as part of a second metallization layer of the semiconductor device, the anti-fuse structure including at least one via electrically connecting the first and second portions of the second electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
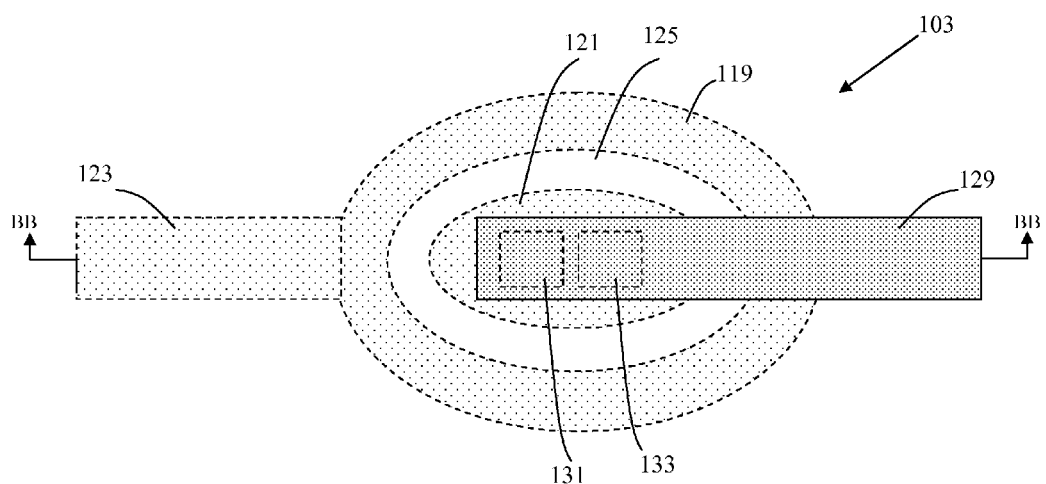
FIG. 1A schematically illustrates a plan view of an axially-oriented, electrical anti-fuse structure for a semiconductor device, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of high programming current and significant space requirements attendant upon forming BEOL metal fuses. By using electrical anti-fuse structures utilizing dielectric breakdown techniques, fuse structures may be formed in a reliable and efficient manner and may be programmed at relatively low power supply voltages and occupy less semiconductor real estate. The anti-fuse may be formed with an anode encircling a portion of cathode but separated therefrom with a dielectric material, with both the cathode and the portion of the anode being formed in the same metal layer. The resulting structure occupies less space the conventional metal fuses. Further, the programming mechanism, dielectric breakdown, requires a lower power supply voltage than the conventional metal fuse.

Methodology in accordance with embodiments of the present disclosure includes forming a first metallization layer on an insulating layer, the first metallization layer including, in a substantially axial plane, a first portion of a first electrode of an anti-fuse structure and a second electrode about the first portion of the first electrode, but separated therefrom, forming, in the substantially axial plane, a dielectric material surrounding the first portion of the first electrode, between the first portion of the first electrode and the second electrode, forming an interlayer dielectric (ILD) over the first metallization layer, forming at least one via through the ILD over the first portion of the first electrode, and forming a second metallization layer over the ILD, the second metallization layer including a second electrode over the at least one via, wherein the at least one via electrically connects the first and second portions of the first electrode, wherein breakdown of the anti-fuse material is configured to enable an operating current to flow between the second electrode and the first electrode in a programmed state of the anti-fuse structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1C:
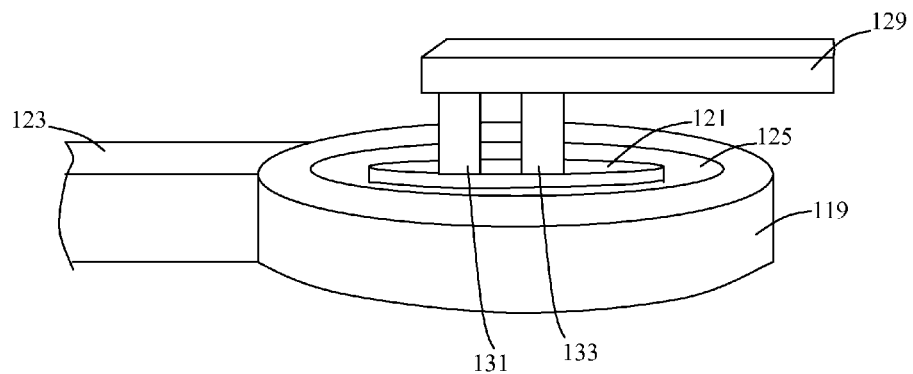
FIG. 1C schematically illustrates a 3-dimensional view of the axially-oriented, electrical anti-fuse structure of FIG. 1A, according to an exemplary embodiment.
Figure 1B:
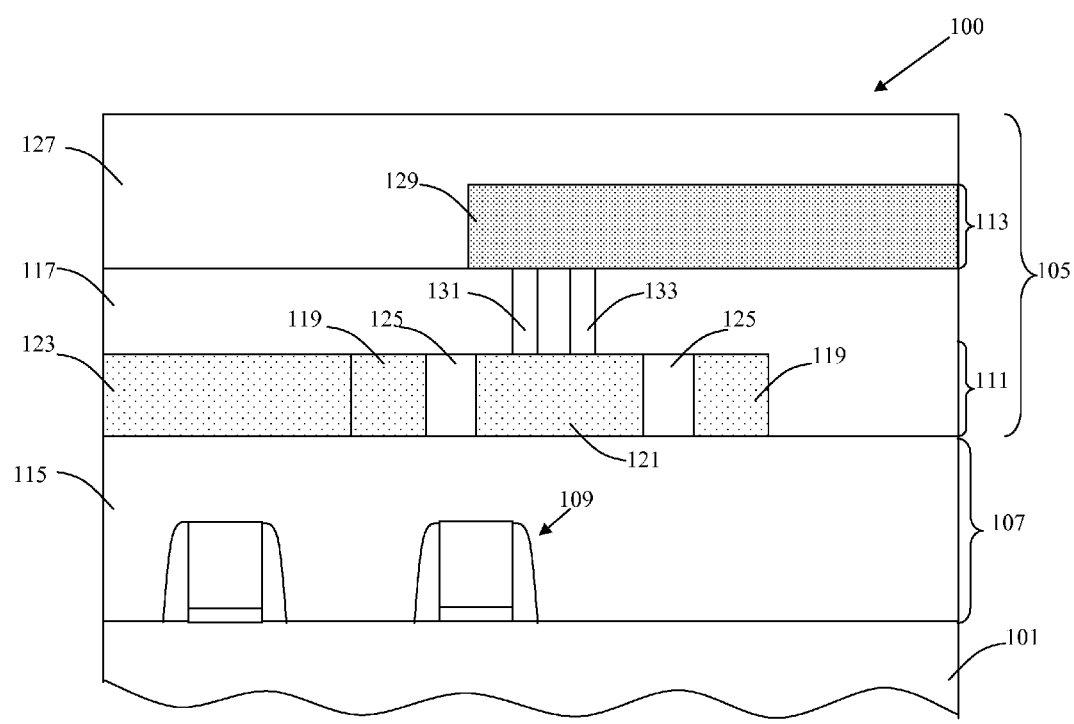
FIG. 1B schematically illustrates a sectional view of the axially-oriented, electrical anti-fuse structure of FIG. 1A taken along sectional line B-B, according to an exemplary embodiment.

FIG. 1A schematically illustrates a plan view of an axially-oriented, electrical anti-fuse structure for a semiconductor device, according to an exemplary embodiment. FIG. 1B schematically illustrates a sectional view of a semiconductor device including the axially-oriented, electrical anti-fuse structure of FIG. 1A taken along sectional line B-B. FIG. 1C schematically illustrates a 3-dimensional view of the axially-oriented, electrical anti-fuse structure of FIG. 1A. Semiconductor device 100 includes substrate 101, i.e., any appropriate carrier material, such as monocrystalline silicon, in and/or above which semiconductor device 100, including electrical anti-fuse structure 103, may be formed. According to exemplary embodiments, anti-fuse structure 103 is an electrically programmable anti-fuse device formed as a BEOL structure, for example as part of a metal 1 layer of metallization system 105. Further, anti-fuse structure 103 is formed in association with a gate-last process, such as a replacement gate process. It is contemplated, however, that structure 103 may alternatively be incorporated as part of a gate-first technology and/or may be provided as part of any appropriate metal layer. As shown, metallization system 105 may be formed above semiconductor device layer 107 that may include one or more integrated circuit (IC) structures (or devices), such as transistor 109. It is contemplated, however, that device layer 107 may include any number of IC structures, such as one or more capacitors, inductors, resistors, transistors, and/or the like.

Metallization system 105 may include two or more metal layers, typically several layers, such as 8 layers, separated by ILDs. Only two metal layers, layers 111 and 113, are shown in FIG. 1B, which respectively represent metal layer 1 and metal layer 2 of metallization system 105. However, anti-fuse 103 may be formed in any two consecutive metal layers "X" and "X+1.". Metallization system 105 is formed over a first ILD 115, and an additional ILD is formed between each pair of consecutive metal layers and filling the spaces between metal lines within each metal layer of metallization system 105. For example, ILD 117 is formed around elements 119, 121, 123, and 125 of anti-fuse 103, between any other metal lines of layer 111, and also between metal layers 111 and 113. Similarly, ILD 127 is formed over metallization layer 113 and between the metal lines of layer 113. The ILDs may be formed of a low dielectric constant material, e.g., silicon dioxide, and may be formed of the same or different materials.

As illustrated in FIGS. 1A through 1C, anti-fuse structure 103 includes metal portions 119 through 123 of metal layer 111 and dielectric layer 125 intervening between metal portions 119 and 121. Dielectric layer 125 in a non-programmed state of anti-fuse structure 103, is configured to mechanically and electrically isolate metal portions 119 and 121. That is, in a non-programmed state, anti-fuse structure 103 exhibits a relatively high resistive state (e.g., approximately 1 to 10 MΩ) capable of preventing an electrically conductive operating path (or current flow) from being established across metal portions 119 and 121. In a programmed state, e.g., when a voltage (or range of voltages) across dielectric layer 125 and, thereby, across metal portions 119 and 121 exceeds a certain threshold value (or range of values), such as approximately 1 to 2 volts, dielectric layer 125 undergoes, for instance, dielectric breakdown. As such, in a programmed state, anti-fuse structure 203 exhibits a relatively low resistive state (e.g., approximately a few hundred ohms (Ω) or less) and, thereby, enables an electrically conductive operating path (or current flow) to be established across metal portions 119 and 121. Dielectric layer 125 may include SiCOH with a dielectric constant of 2.7 when formed in a metal 1 layer, such as in FIG. 1B, or may include an ultra low-k (ULK) dielectric material, for example having a dielectric constant of 2.55 when formed in any of metal layers 2 through 8. Further, the width of dielectric layer 125 may be the minimum allowed distance, for example 40 nm.

Figure 2:
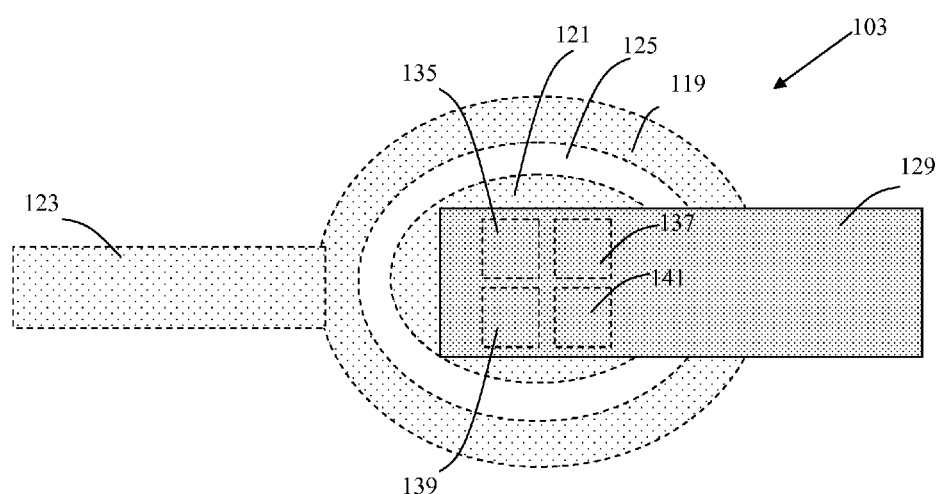
FIGS. 2 and 3 schematically illustrate plan views of alternative via configurations for axially-oriented, electrical anti-fuse structures for semiconductor devices, according to various exemplary embodiments.
Figure 3:
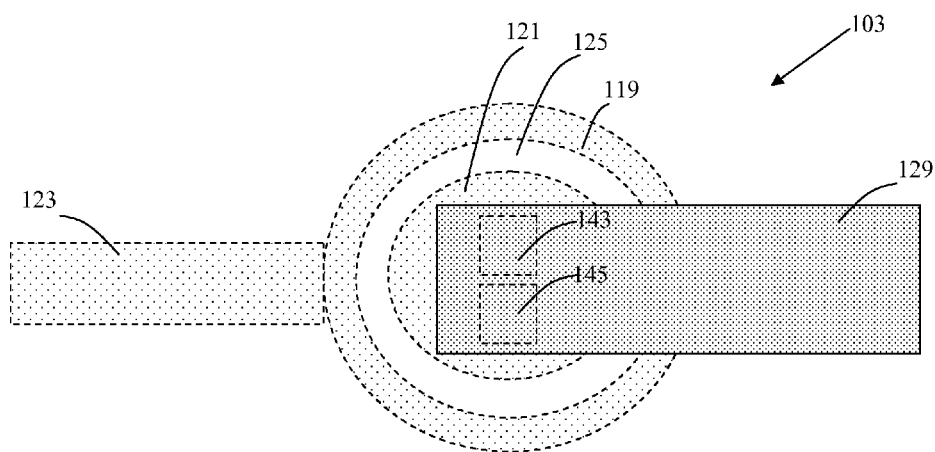

Metal portions 119 through 123 may include one or more conductive metal materials, such as aluminum, copper, tungsten, and/or the like. Although metal portions 119 and 121 are illustrated as ovals, they may alternatively be formed as concentric circles or rings. Portion 119 completely encircles dielectric layer 125 and metal portion 121 so that when dielectric 125 breaks down, the metal from metal portion 121 is captured in the ring and cannot damage other portions of the semiconductor device. In FIG. 1A metal portions 119 through 123 and dielectric layer 125 are shown with dotted outlines, as ILD 117 (not shown in FIG. 1A for illustrative convenience) overlies portions 119 through 125, as shown in the cross-sectional view in FIG. 1B. Metal portion 129 of metal layer 113 in combination with at least one via, such as vias 131 and 133, may include one or more of the aforementioned conductive metal materials. It is contemplated that anti-fuse structure 103 may incorporate any suitable number of vias, such as 1 to 10, for example 2 or 4 small vias or 1 large via, which may be spatially disposed in any suitable configuration. For instance, two alternative via configurations are shown in FIGS. 2 and 3. Specifically, in FIG. 2 four vias 135 through 141 are illustrated in a square configuration, and in FIG. 3 two vias 143 and 145 are vertically oriented whereas in FIG. 1A the two vias 131 and 135 are horizontally oriented. Also, in FIG. 3, metal portions 119 and 121 and intervening dielectric layer 125 are concentric circles rather than ovals.

The combination of metal portions 123 and 119 serve as a first electrode (e.g., an anode) of anti-fuse structure 103 and the combination of features 121 and 129 through 133 serve as a second electrode (e.g., a cathode) of anti-fuse structure 103. Portions 119 through 125 may be formed in (e.g., sharing) an axial (or substantially axial) plane, parallel (or substantially parallel) to an imaginary X-Y plane.

Upon programming electrical anti-fuse structure 103, a programming current with a duration of 5 to 50 microseconds (or tenths of microseconds) may be initiated across metal portions 119 and 121 by activating a corresponding voltage source (not shown) that may be directly or indirectly connected to metal portions 123 and 129 and, thereby, to metal portions 119 and 121. A programming current of approximately 2 to 20 milliamperes may be utilized. Depending on the supply voltage, dielectric layer 125 may be subjected to a sufficient amount (or range of amounts) of stress to breakdown dielectric layer 125 and, thereby, enable at least one axial (or substantially axial) current path to be established between metal portions 119 and 121. For instance, breakdown of dielectric layer 125 may occur as a result of establishing 1 to 2 volts between metal portions 119 and 121. In this manner, the breakdown of dielectric layer 125 may facilitate diffusion of metal from, for instance, metal portion 121. As previously described, metal portion 119 may serve as a bounding feature, such that this diffusion of metal may be contained within an interior region of metal portion 119. After sufficient breakdown of dielectric layer 125, the programming current may be terminated.

The embodiments of the present disclosure can achieve several technical effects, such as providing fuse structures (i.e., anti-fuses) formed BEOL which utilize a lower programming voltage and occupy less space than previous fuses. The present disclosure enjoys industrial applicability in any of various types of highly integrated semiconductor devices, such as non-volatile memory devices, particularly sub-30 nanometer devices, as well as highly integrated gate-last semiconductor technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    initiating a programming current in an anti-fuse structure configured to prevent an operating current from flowing between a first electrode and a second electrode in a non-programmed state of the anti-fuse structure, the programming current being configured to flow in a substantially axial plane between the first electrode and a portion of the second electrode, the first electrode and the portion of the second electrode being concentrically separated by a dielectric material; and
    terminating the programming current after sufficient breakdown of the dielectric material,
    wherein sufficient breakdown of the dielectric material enables the operating current to flow between the first electrode and the second electrode in a programmed state of the anti-fuse structure.

2. The method according to claim 1, comprising initiating the programming current for 5 to 50 microseconds.

3. The method according to claim 1, wherein the programming current is 2 to 20 milliamperes.

4. The method according to claim 1, wherein the programming current establishes a voltage of 1 to 2 volts between the first and second electrodes.

5. The method according to claim 1, wherein the first electrode is concentrically formed about the first portion of the second electrode, and the first electrode has a ring or oval shape.

6. The method according to claim 5, wherein a distance between the first portion of the second electrode and the first electrode is 40 nm.

7. The method of claim 1, wherein the first electrode and the portion of the second electrode are formed as part of a first metallization layer of a semiconductor device, and a second portion of the second electrode is formed as part of a second metallization layer of the semiconductor device, the anti-fuse structure including at least one via electrically connecting the first and second portions of the second electrode.

8. The method according to claim 7, wherein:
    the first metallization layer is a metal 1 layer; and
    the dielectric material comprises SiCOH having a dielectric constant of 2.7.

9. The method according to claim 7, wherein:
    the first metallization layer is one of a metal 2 layer through a metal 8 layer; and
    the dielectric material comprises an ultra low-k (ULK) material having a dielectric constant of 2.55.

* * * * *